(12) United States Patent
Coan et al.

(10) Patent No.: US 8,737,526 B2
(45) Date of Patent: May 27, 2014

(54) PREDISTORTION OF COMPLEX MODULATED WAVEFORM

(75) Inventors: Philip David Coan, La Jolla, CA (US); Paul J. Draxler, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 433 days.

(21) Appl. No.: 12/827,952

(22) Filed: Jun. 30, 2010

(65) Prior Publication Data

US 2012/0002752 A1 Jan. 5, 2012

(51) Int. Cl.
*H04L 25/49* (2006.01)
*H04L 25/03* (2006.01)
*H04K 1/02* (2006.01)

(52) U.S. Cl.
USPC .............................. 375/297; 375/295; 375/299

(58) Field of Classification Search
USPC ................ 375/295, 297, 299; 455/114.3, 522
See application file for complete search history.

(56) References Cited

U.S. PATENT DOCUMENTS

| | | | |
|---|---|---|---|
| 6,029,285 | A | 2/2000 | Belcher et al. |
| 6,141,390 | A | 10/2000 | Cova |
| 6,211,733 | B1 | 4/2001 | Gentzler |
| 6,275,685 | B1 * | 8/2001 | Wessel et al. ............... 455/126 |
| 6,885,242 | B2 | 4/2005 | Leffel et al. |
| 7,109,792 | B2 | 9/2006 | Leffel |
| 7,479,828 | B2 | 1/2009 | Benedict |
| 7,529,524 | B1 | 5/2009 | Giallorenzi et al. |
| 8,055,217 | B2 * | 11/2011 | Ba et al. ..................... 455/114.3 |
| 8,229,025 | B1 | 7/2012 | Summerfield |
| 2002/0171485 | A1 | 11/2002 | Cova |
| 2003/0132802 | A1 | 7/2003 | Ring et al. |
| 2004/0001559 | A1 * | 1/2004 | Pinckley et al. ............. 375/297 |
| 2004/0105509 | A1 | 6/2004 | McGowan et al. |
| 2004/0203540 | A1 | 10/2004 | Anvari et al. |
| 2007/0004358 | A1 | 1/2007 | Moorti |
| 2008/0159435 | A1 | 7/2008 | Cohen |

(Continued)

FOREIGN PATENT DOCUMENTS

| | | |
|---|---|---|
| CN | 101272155 A | 9/2008 |
| EP | 1011192 A2 | 6/2000 |

(Continued)

OTHER PUBLICATIONS

International Search Report and Written Opinion—PCT/US2011/042719, International Search Authority—European Patent Office—Sep. 30, 2011.

*Primary Examiner* — Ted Wang
(74) *Attorney, Agent, or Firm* — William M. Hooks

(57) ABSTRACT

Exemplary embodiments of the invention include a transmitter system configured to predistort an input signal to generate a target output signal. An exemplary transmitter system includes a forward path including a predistortion device coupled with an amplifier, the forward path configured for predistorting an input signal to the predistortion device in response to a phase error compensation signal and an amplitude error compensation signal in order to generate a desired output signal for the output signal of the amplifier, and a feedback path including a processor configured for generating the phase error compensation signal and the amplitude error compensation signal based on a comparison of the input signal with phase and amplitude information of the output signal of the amplifier, wherein the phase and amplitude information of the amplifier are transmitted to the processor on a single path of the feedback path. Other methods and apparatuses are also presented herein.

29 Claims, 13 Drawing Sheets

(56) References Cited

U.S. PATENT DOCUMENTS

| | | |
|---|---|---|
| 2008/0218262 A1 | 9/2008 | Ziegler et al. |
| 2009/0184763 A1 | 7/2009 | Kim |
| 2009/0207896 A1 | 8/2009 | Behzad |
| 2010/0093290 A1 | 4/2010 | Van Zelm et al. |
| 2010/0271123 A1 | 10/2010 | Forrester et al. |
| 2010/0323641 A1 | 12/2010 | Aparin et al. |
| 2011/0143791 A1 | 6/2011 | Pan et al. |
| 2013/0094550 A1 | 4/2013 | Coan et al. |

FOREIGN PATENT DOCUMENTS

| | | |
|---|---|---|
| EP | 1065856 A2 | 1/2001 |
| EP | 1193862 | 4/2002 |
| EP | 1612933 A1 | 1/2006 |
| TW | 200913598 A | 3/2009 |
| WO | WO2004105231 | 12/2004 |

* cited by examiner

PREDISTORTION OF COMPLEX MODULATED WAVEFORM

BACKGROUND

1. Field

The present disclosure relates generally to radio frequency (RF) power amplifiers, and in particular, to a system and method of performing adaptive digital predistortion (DPD) of complex modulated waveform based on metrics of a system, such as a difference in phase and amplitude between an input and output signal.

2. Background

In the wireless communications field, there is a general need for devices capable of transmitting more data within a given bandwidth, and at the same time achieving a reasonable or optimal power efficiency to conserve battery power. For instance, wireless devices have been designed with different modulation schemes, such as quadrature amplitude modulation (QAM) having 16, 32, or 64 constellations, to increase the data throughput within a given bandwidth. Additionally, wireless devices have also been designed using power amplifiers that operate close to their saturation region, such as class A/B, B, C, and other class amplifiers, to improve the power consumption efficiency.

Because of the relatively high spectral efficiency of the data transmission, such wireless devices often have tight requirements on the allowable spectral leakage. In some cases, these requirements present a problem for operating power amplifiers close to their saturation regions because the nonlinearity characteristic of the amplifier causes significant spectral regrowth and in-band distortion. One solution is to backoff the operation of the amplifier into its linear region so as to reduce or prevent this distortion. However, this results in reduced power efficiency for the device, which has adverse impact on the battery life and continued use of the device.

Another solution is to operate the power amplifier near its saturation or nonlinear region, and use a predistortion device at the input of the amplifier to distort the input signal so as to correct or reduce the distortion of the output signal caused by the nonlinearity of the amplifier. There are generally two approaches: an open loop approach and a closed loop approach. The open loop approach typically works well as long as the nonlinear characteristic of the amplifier is accurately modeled and does not significantly change over time with environmental conditions. The closed loop approach involves providing adaptation to the predistortion device so that it can model the nonlinear characteristic of the power amplifier in "real time," and adjust the predistortion of the input signal in accordance with the present model of the amplifier. However, often these adaptation techniques are complicated and expensive, as discussed as follows.

FIG. 1 illustrates a block diagram of a typical closed loop transmitter system 100 that uses a demodulation technique to provide information about an output signal in order to apply predistortion of an input signal to compensate for distortion in the output signal caused by a power amplifier. In particular, the transmitter system 100 includes a digital predistortion (DPD) device 102, a digital-to-analog converter (DAC) 104, an automatic gain control (AGC) 106, an up-converting mixer 108, and a power amplifier 110. The transmitter system 100 further includes a demodulation section including a power splitter 112, a pair of mixers 114 and 116, an oscillator 120, a 90° phase shifter 118, and a pair of filters 122 and 124.

The DPD device 102 predistorts an input baseband or intermediate frequency (IF) digital signal based on signals received from the demodulation section in order to achieve a target signal at the output of the power amplifier 110. The DAC 104 converts the predistorted digital signal from the DPD device 102 into an analog signal. The AGC 106 dynamically amplifies or attenuates the analog signal in order to achieve a target power level for the signal at the output of the power amplifier 110. The up-converting mixer 108 uses a local oscillator (L.O.) to upconvert the baseband or IF analog signal into a radio frequency (RF) signal. The power amplifier 110 amplifies the RF signal to generate an output signal.

The demodulation section converts a sampled portion of the output signal into an I/Q IF or baseband signals for use by the DPD device 102 in predistorting the input digital signal to achieve a target RF output signal for the transmitter 100. The power splitter 112 splits the sampled output signal into two components for processing by the I- and Q-portions of the demodulation section. The mixer 114 uses the signal from the oscillator 120 to down convert the sampled output signal into an I-component IF or baseband signal. The filter 122 removes high order frequency components from the I-signal. Similarly, the mixer 116 uses the signal from the oscillator 120 shifted in phase by 90 degrees by the phase shifter 118 to down convert the sampled output signal into a Q-component IF or baseband signal. The filter 124 removes high order frequency components from the Q-signal. The filtered I-signal and Q-signal are converted from the analog domain to the digital domain through analog-to-digital converters (ADC) 126, 128, respectively.

There are many drawbacks with the demodulation approach. For instance, the circuitry is very complex requiring a demodulation section to generate I- and Q-IF or baseband signals for use by the DPD device in predistorting the input digital signal to achieve a target output signal. The complexity is further underscored by the fact that the I- and Q-signals should be time aligned with the input signal for the system to operate properly. The I- and Q-signals may each require separate mixers, filters, and ADCs, which components may add to the power consumption and die area required by the transmitter system 100.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 2:
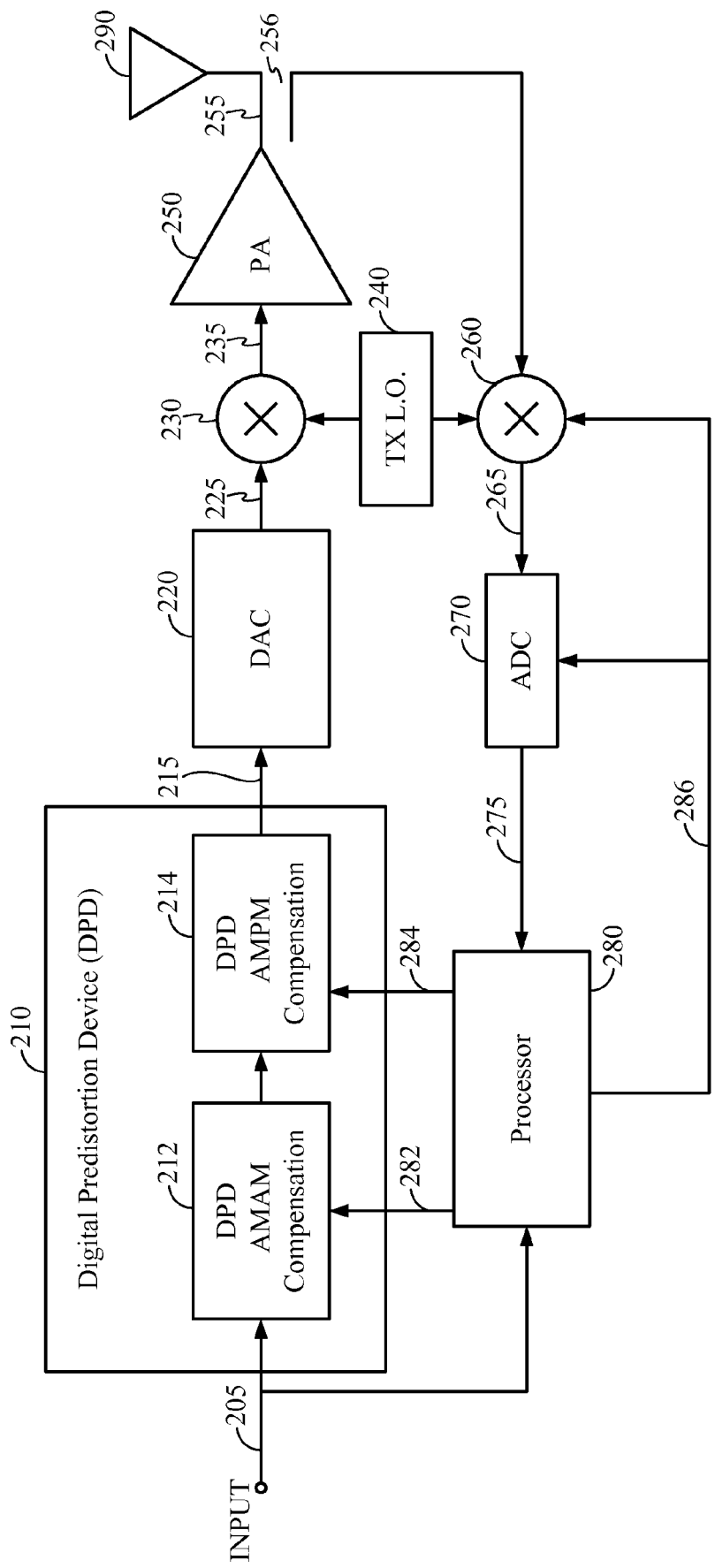
FIG. 2 illustrates a schematic block diagram of an exemplary transmitter system in accordance with an exemplary embodiment of the present invention.

FIG. 2 illustrates a schematic block diagram of an exemplary transmitter system 200 in accordance with an exemplary embodiment of the present invention. Transmitter system 200 includes a digital predistortion (DPD) device 210 operably coupled in a forward path with a power amplifier (PA) 250. The forward path of the transmitter system 200 further includes a digital-to-analog converter (DAC) 220 and up-converting mixer 230. Transmitter system 200 includes a feedback path that may include a down-converting mixer 260, analog-to-digital converter (ADC) 270, and processor 280. The feedback path may receive the output signal 255 through power splitter 256.

The DPD device 210 may be configured to perform amplitude-to-amplitude modulation (AMAM) compensation 212 and amplitude-to-phase modulation (AMPM) compensation 214 on an input signal 205. Input signal 205 may be a complex waveform, such as a baseband signal or an intermediate frequency (IF) digital signal. As discussed in more detail below, the DPD device 210 is configured to distort an input signal 205 to achieve a target output signal for the PA 250 or otherwise correct or reduce distortion of the output signal 255 due to the nonlinearity characteristics of the transmitter system 200, which includes PA 250.

The DPD device 210 is configured to add predistortion to an input signal 205 by performing AMAM compensation 212 and AMPM compensation 214 in response to the amplitude error compensation signal 282 and phase error compensation signal 284. As a result, the DPD device 210 generates a predistorted digital signal 215. The predistortion applied to the input signal 205 may be configured to achieve a target signal at the output signal 255 of the PA 250 (e.g., radio frequency (RF) output signal). For example, the AMAM compensation 212 and AMPM compensation 214 may be approximately opposite from the amplitude and phase distortion that results from the PA 250, such that when a signal (e.g., 235) is amplified by the PA 250, the output signal 255 is a desired target signal rather than an undesired distorted signal.

The DAC 220 converts the predistorted digital signal 215 from the DPD device 210 into a predistorted analog signal 225. The up-converting mixer 230 uses a transmitter local oscillator (TX L.O.) 240 to up-convert the predistorted analog signal 225 from a baseband or IF signal into an intermediate RF signal 235. The PA 250 amplifies the intermediate RF signal 235 to generate an output signal 255. The output signal 255 may then be transmitted to a remote device via antenna 290. The output signal 255 may also be provided to the feedback path of transmitter system 200 via power splitter 256.

The feedback loop of the transmitter system 200 includes down-converting mixer 260, ADC 270, and processor 280. Down-converting mixer 260 is driven by TX L.O. 240 for down converting the frequency of the output signal 255 to generate intermediate feedback analog signal 265, which may be a baseband or IF signal. ADC 270 converts the intermediate feedback analog signal 265 to generate digital feedback signal 275.

Processor 280 receives input signal 205 and digital feedback signal 275. Processor 280 is configured to perform a predistortion control function. Specifically, the predistortion control function determines an appropriate phase and amplitude compensation in response to the received input signal 205 and digital feedback signal 275. More detail concerning the predistortion control function may be discussed with reference to FIGS. 3A-3C. In response to the results of the predistortion control function, processor 280 generates amplitude error compensation signal 282 and phase error compensation signal 284, which signals 282, 284 are transmitted to the DPD device 210 for adjusting the predistortion by performing AMAM compensation 212 and AMPM compensation 214.

The digital feedback signal 275 is generated by sampling the output signal 255 at a sample rate determined by the control trigger signal 286 generated by processor 280. For example, the control trigger signal 286 triggers the components in the feedback path (i.e., ADC 270, down-converting mixer 260) at a desired predetermined sample rate, at the occurrence of certain events, or any combination thereof. Control trigger signal 286 and examples of contemplated sampling schemes are described in relation to FIG. 8.

It is noted that components and functions of the transmitter system 200 have been illustrated and described to be configured and performed in a particular order; however, such a configuration is intended as an exemplary embodiment. For example, the DAC 220 may be located between different components of the forward path. As a result, at least some of the compensation (i.e., predistortion) performed by the DPD device 210 to the input signal 205 may be performed in the analog domain as opposed to the digital domain. Additionally, methods for up-converting signals to an RF signal may be performed in the digital domain as opposed to the analog domain. Thus, the DAC 220 may be located at various locations along the forward path. Likewise, ADC 270 may be located at different locations of the feedback path (e.g., operably coupled between the power splitter 256 and down-converting mixer 260).

Other variations of the location of other components and the order of functions performed by components may also be contemplated. In the example above, AMAM compensation 212 is shown to be performed prior to AMPM compensation 214. In that situation, after AMAM compensation 212 is performed, the dominant distortion remaining for compensation is phase distortion, which may be compensated for by AMPM compensation 214. The AMPM compensation 214 may then be applied to compensate for phase distortion, such that the resulting vectors for the output signal 255 and the desired target output signal may be aligned. Although AMAM compensation 212 is shown to be performed prior to AMPM compensation 214, AMPM compensation 214 may be performed prior to AMAM compensation 212 in an alternative exemplary embodiment. Additionally, the order of the actual compensation functions may be independent from the order that the processor 280 determines the values needed for compensation (see, e.g., FIGS. 3A-3C). For example, the processor 280 may determine the phase compensation value prior to the amplitude compensation value, and the DPD device 210 may perform AMAM compensation 212 of the input signal 205 prior to AMPM compensation 214.

In other words, based on the input signal 205 and the digital feedback signal 275, the processor 280 modifies the amplitude error compensation signal 282 and the phase error compensation signal 284 so that these signals better reflect (e.g., reduce or offset distortion) the actual performance of the PA 250. The processor 280 then sends the amplitude error compensation signal 282 and the phase error compensation signal 284 to the DPD device 210, which responsively predistorts the input signal 205 to achieve a target or specified output signal 255 for the transmitter system 200. The process may be repeated again as desired or specified. Any of the above-described operations may have appropriate validity checks to ensure that the adapted amplifier model substantially reflects the actual performance of the amplifier 280.

Figure 1:
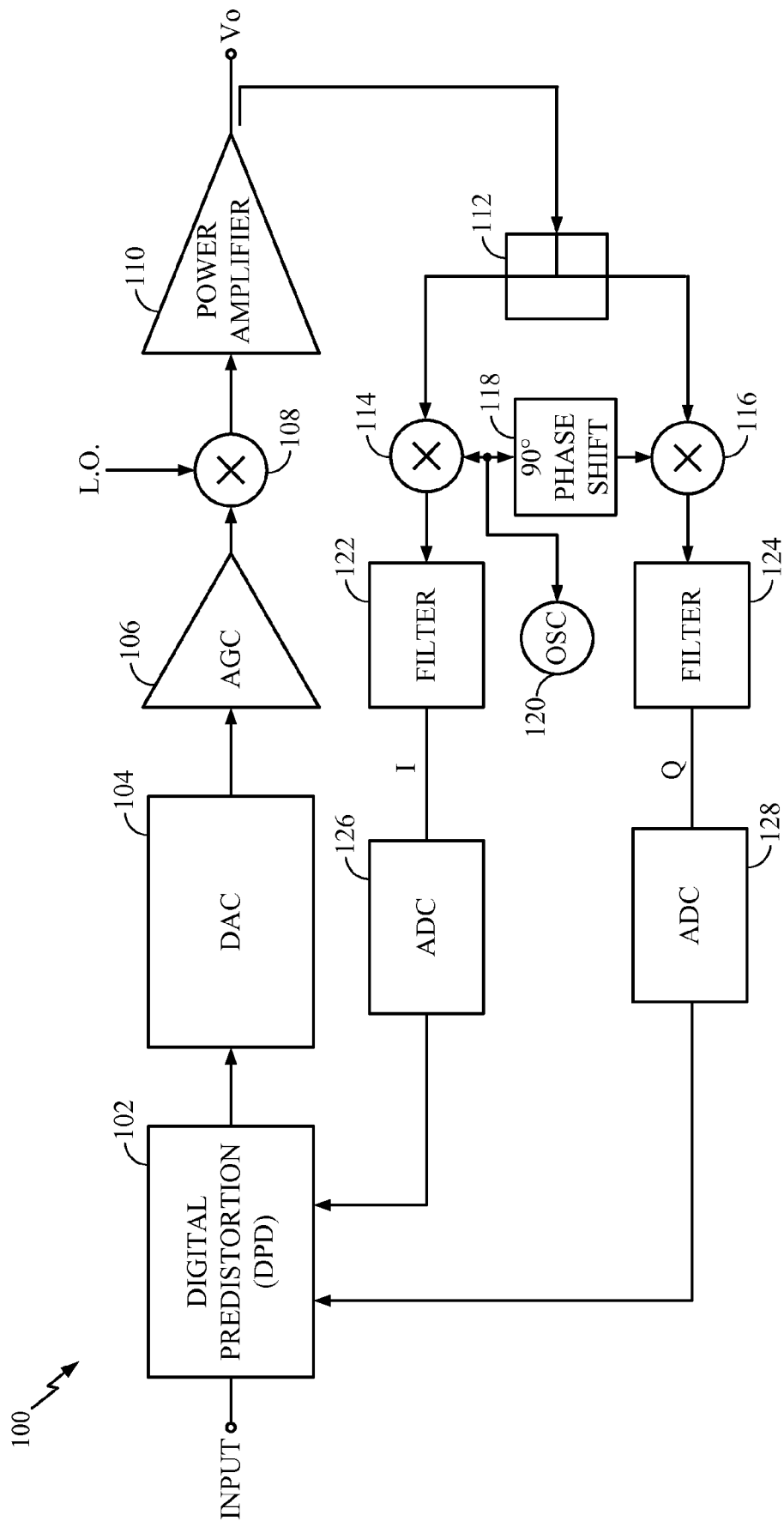
FIG. 1 illustrates a block diagram of a conventional closed loop transmitter system that uses a demodulation technique to provide information about an output signal in order to apply predistortion of an input signal to compensate for distortion in the output signal caused by a power amplifier.

In summary, the transmitter system 200 is configured to provide amplitude and phase compensation (i.e., predistortion) for an input signal 205, such that the output signal 255 generated by the PA 250 is a desired target signal rather than a distorted signal. Such predistortion of the input signal 205 may permit the PA 250 to be more efficient, and operate more closely to the PA's 250 saturation region. The amplitude and phase compensation may be determined based on a comparison of the input signal 205 with phase and amplitude information of the output signal 255, the phase and amplitude information being transmitted to processor 280 by a single path of the feedback path. The transmitter system 200 may have advantages over the conventional transmitter system shown in FIG. 1, such as, for example, transmitter 200 may be less complex, use fewer components, be implemented with less die area, consume less power, or exhibit other advantages not listed herein.

Figure 3A:
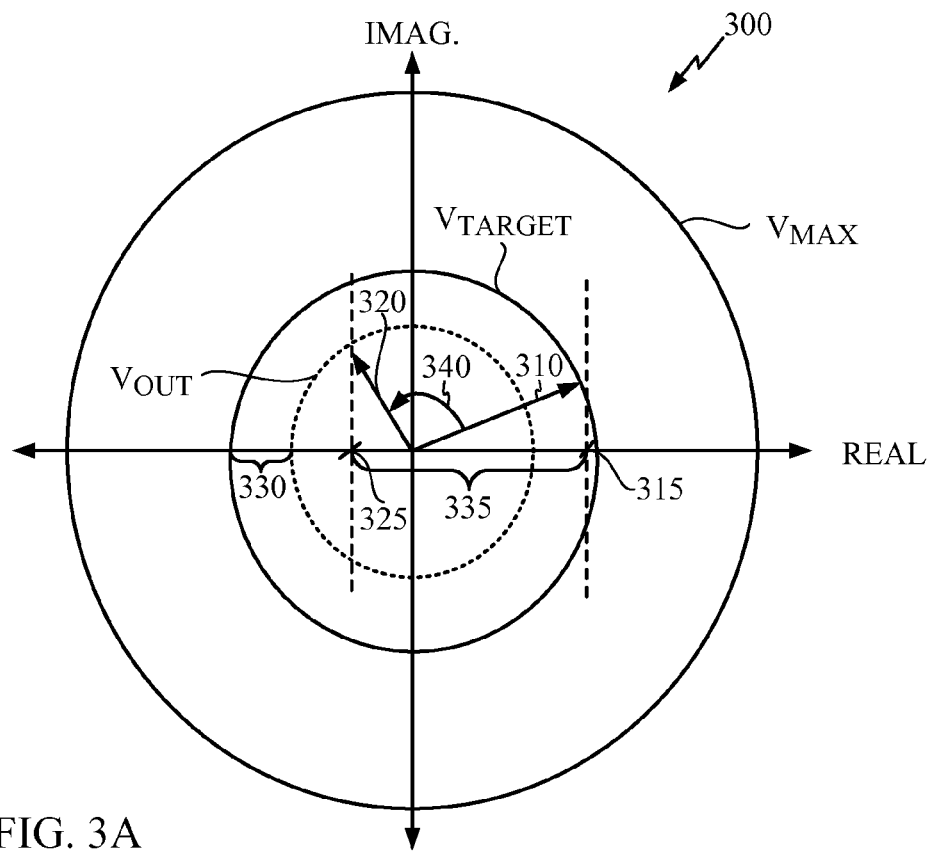
FIGS. 3A-3C illustrate graphs including complex signals represented as vectors, which may be employed in determining compensation signals in accordance with an exemplary embodiment of the present invention.
Figure 3B:
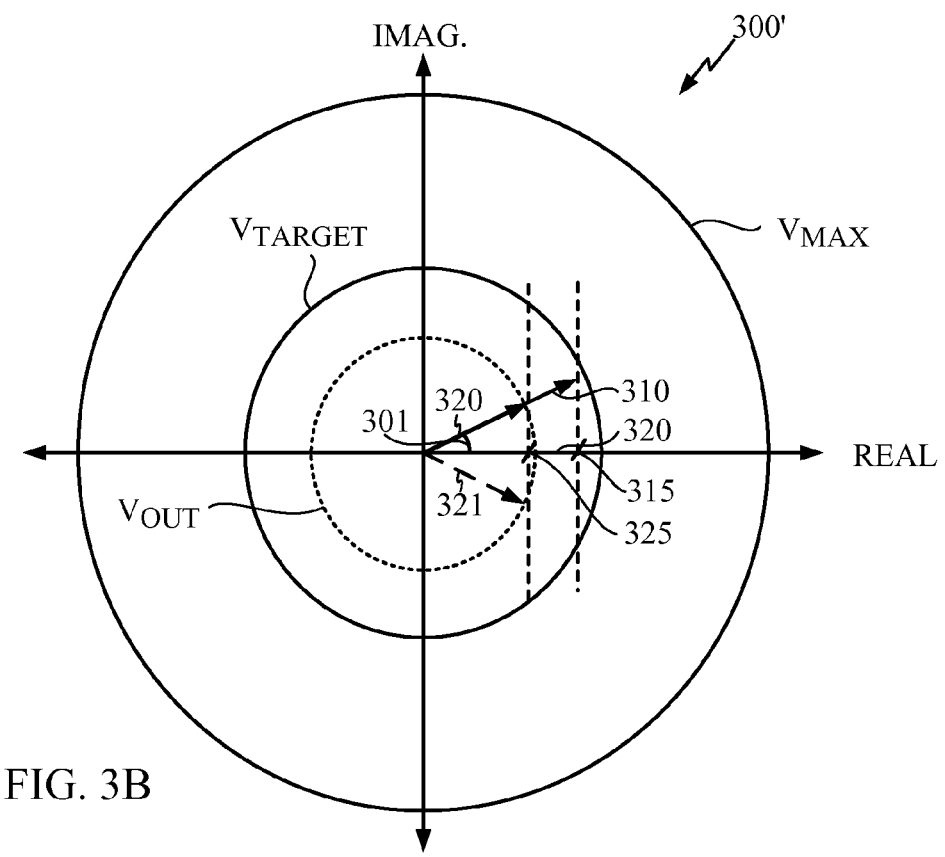
Figure 3C:
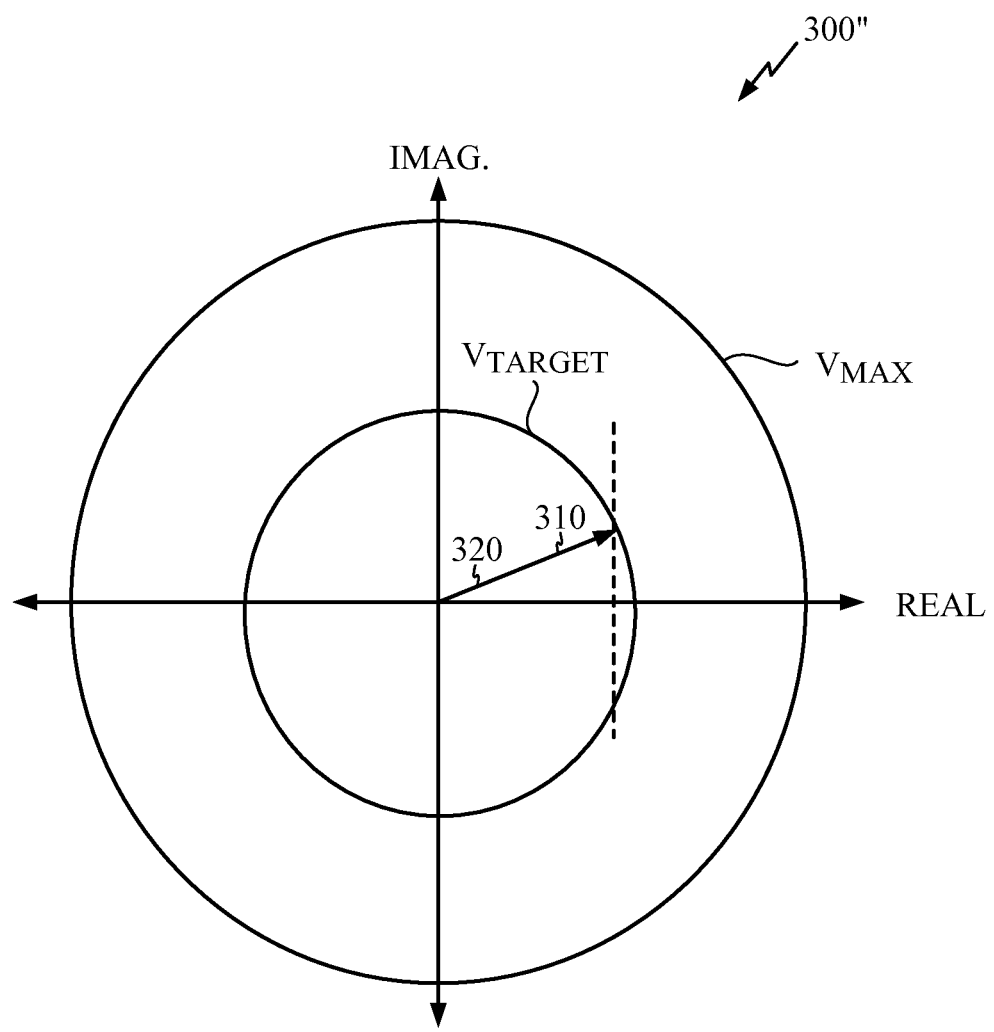

FIGS. 3A-3C illustrate graphs 300, 300', 300" including complex signals represented as vectors 310, 320, which may be employed in determining compensation signals (e.g., 282, 284 of FIG. 2) in accordance with an exemplary embodiment of the present invention. In other words, FIGS. 3A-3C illustrate an exemplary method for determining the desired compensation for predistorting the input signal to generate the desired output signal from the power amplifier.

It is noted that FIGS. 3A-3C are a graphical illustration of exemplary operations which may be performed within a processor (e.g., 280 of FIG. 2) as part of a predistortion control function for determining (e.g., estimating, calculating, etc.) appropriate values for phase and amplitude compensation in response to the received input signal 205 and digital feedback signal 275. Thus, in response to the results of the exemplary predistortion control function represented by FIGS. 3A-3C, the processor 280 generates amplitude error compensation signal 282 and phase error compensation signal 284, which signals 282, 284 are transmitted to the DPD device 210 for adjusting the predistortion by performing AMAM compensation 212 and AMPM compensation 214.

The horizontal axes of graphs 300, 300', 300" represent the real components of the complex signals, and the vertical axes represent the imaginary components of the complex signals. Each of FIGS. 3A-3C illustrate a target reference vector 310 and an output vector 320. Each vector 310, 320 may be represented by a magnitude (i.e., length of the vector) and a phase (i.e., angle between the vector and the positive real axis) of a complex signal at an instant in time. Circle $V_{TARGET}$ represents the amplitude of the target reference vector 310 with a given complex pair. Circle $V_{OUT}$ represents the amplitude of the output vector 320 with a given complex pair.

By way of example, the target reference vector 310 may be an input signal (e.g., 205 of FIG. 2), and the output vector may be a corresponding digital feedback signal (e.g., 275 of FIG. 2) as received by a processor (e.g., 280 of FIG. 2) for the substantially same instant of time. In particular, FIG. 3A illustrates a graph 300 illustrating that the output vector 320 exhibits both amplitude error and phase error, which errors may be caused by distortion in a power amplifier. The amplitude error can be seen as the difference in length 330 between $V_{TARGET}$ and $V_{OUT}$. The phase error is represented by the difference in phase 340 between output vector 320 and target reference vector 310.

The processor may determine the desired phase compensation value by comparing the amplitudes and phases of the two vectors 310, 320. For example, the vectors 310, 310 may be projected onto the REAL axis in order to determine the real components 315, 325 of the vectors 310, 320, respectively. The difference between the real components 315 and 325 is shown by line 335. If no amplitude or phase error were to exist, the difference 335 would be zero as the two vectors 310, 320 would be projected upon each other (FIG. 3C). The fact that a difference 335 does exist indicates that at least one of phase error or amplitude error does exist.

FIG. 3B is a graph 300' illustrating a status of vectors 310, 320 within a processor at a later stage in the exemplary analysis for determining the desired compensation for phase error and amplitude error. For example, the processor may execute a function that varies the phase for the output vector 320 until the difference 335 between real components 315 and 325 reaches a minimum value. As the output vector 320 is moved back and forth, when a minimum value is reached for difference 335, the two vectors 310, 320 may be in phase (i.e., have the same angle 301). The phase compensation applied to the output vector 310 to reach It should be noted that a second vector 321 may exist which minimizes the difference 335, but which second vector 321 is not in phase with the target reference vector 320. Second vector 321 has a phase of opposite sign (i.e., negative in this example) of the target reference vector 310. In order to correct for this phase ambiguity, it may be desirable to obtain a plurality of samples of the input signal and output signal at a plurality of different time instances. With a plurality of samples, the phase ambiguity may be resolved by converging to the correct phase compensation value. The phase compensation value may be stored in a look-up table for future reference, such as for determining the amplitude compensation based on the corresponding phase compensation. As shown in FIG. 3C, when both amplitude and phase of the two vectors 710, 720 exists then the vectors 710, 720 are substantially the same. During a predistortion operation, information related to the amplitude and phase compensation values may be transmitted from a processor (e.g., 280 of FIG. 2) to a DPD device (e.g., 210 of FIG. 2) and the DPD device 210 may apply the AMAM compensation 212 and the AMPM compensation 214 on the input signal 205 in response thereto.

Figure 4:
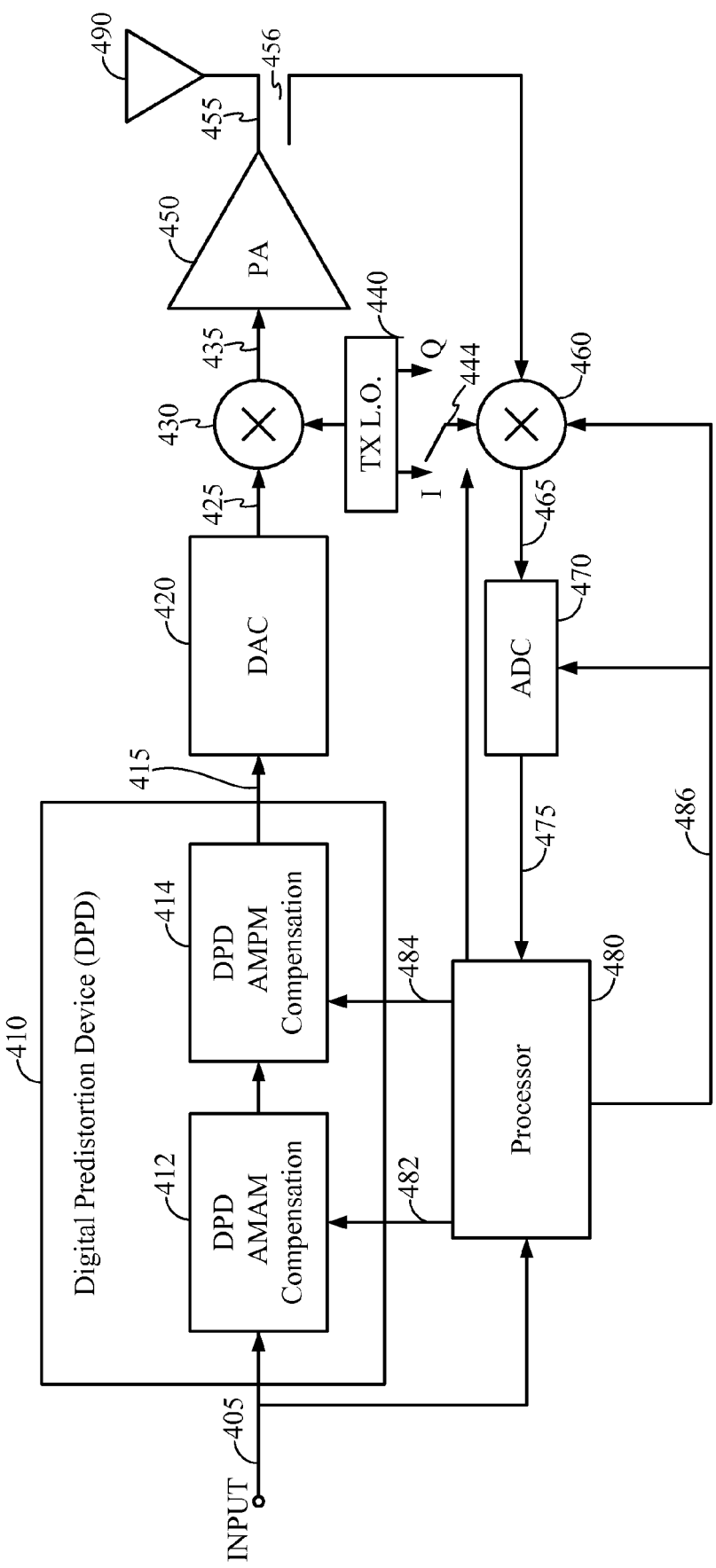
FIG. 4 illustrates a transmitter system in accordance with an exemplary embodiment of the present invention.

FIG. 4 illustrates a transmitter system 400 in accordance with an exemplary embodiment of the present invention. The transmitter system 400 includes a forward path and a feedback path. In the forward path, transmitter system 400 includes DPD device 410, DAC 420, up-converting mixer 430, and PA 450, which may be configured as previously described with respect to similar components illustrated by FIG. 2. Similarly named and numbered signals may also be similarly configured. In the feedback path, the transmitter system 400 includes down-converting mixer 460, ADC 470, and processor 480. The TX L.O. 440 is operably coupled between the up-converting mixer 430 and the down-converting mixer 460. The TX L.O. 440 is configured to generate I- and Q-signals for the down-converting mixer 460. The feedback path further includes a switch 444 operably coupled between the down-converting mixer 460 and the TX L.O. 440.

A switch control signal 488 may be generated by processor 480 for enabling the switch 444 to alternate between the I- and Q-signals, such that the I- and Q-signals are alternatingly received by the down-converting mixer 460 for generating intermediate feedback analog signal 465. Switching between the I- and Q-signals may reduce the number of ADCs that are required in the feedback path as the I- and Q-signals are transmitted to the processor 480 on a shared path of the feedback path. Switching between the I- and Q-signals from the TX L.O. 440 may permit the processor 480 to further resolve the phase ambiguity when determining the phase compensation values for predistorting the input signal 405.

Based on the input signal 405 and the I- and Q-signals on the feedback path for the output signal 455, the processor 480 modifies the amplitude error compensation signal 482 and the phase error compensation signal 484 so that these signals 482, 484 better reflect (e.g., reduce or offset distortion) the actual performance of the PA 450. The processor 480 then sends the amplitude error compensation signal 482 and the phase error compensation signal 484 to the DPD device 410, which responsively predistorts the input signal 405 to achieve a target or specified output signal 455 for the transmitter system 400. The process may be repeated again as desired or specified. Any of the above-described operations may have appropriate validity checks to ensure that the adapted amplifier model substantially reflects the actual performance of the amplifier 480.

Figure 5:
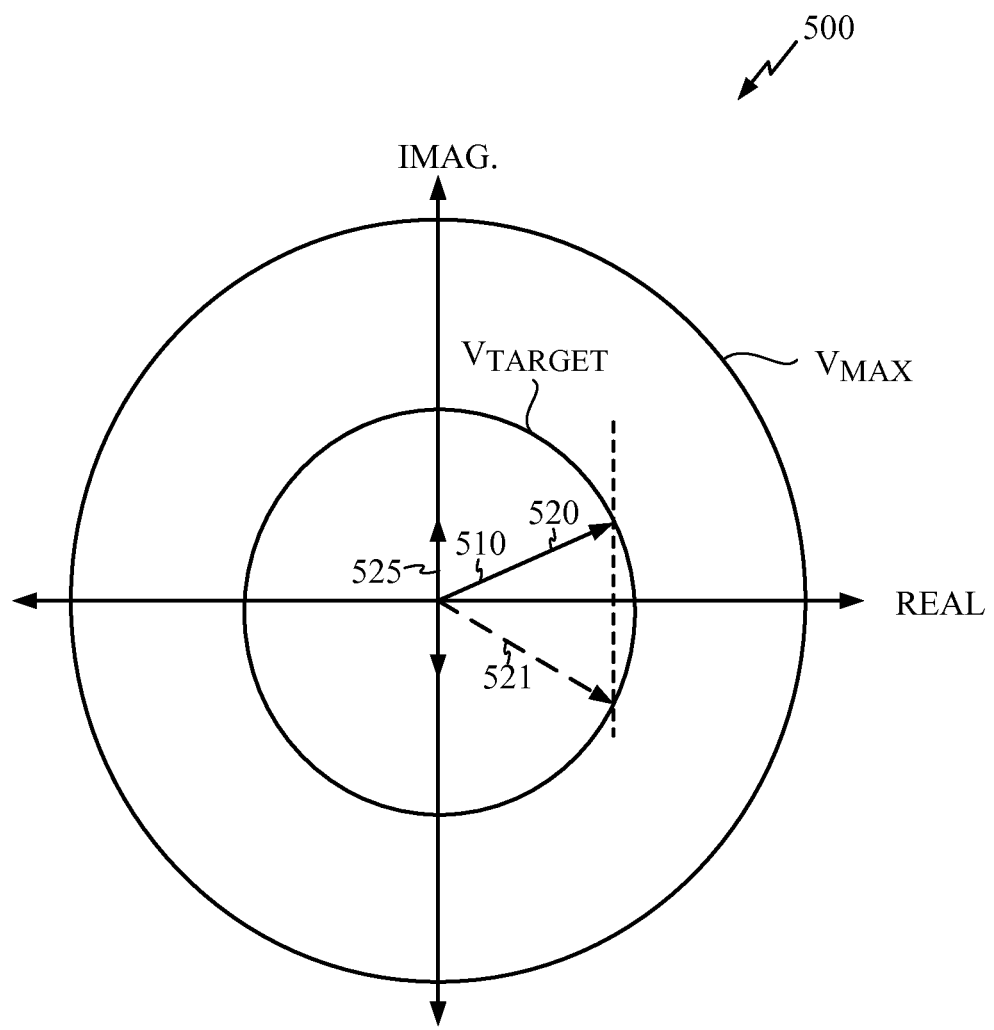
FIG. 5 is a graph including complex signals represented as vectors, which may be employed in determining compensation signals in accordance with an exemplary embodiment of the present invention.

FIG. 5 is a graph 500 including complex signals represented as vectors 510, 520, which may be employed in determining compensation signals (e.g., 482, 484 of FIG. 4) in accordance with an exemplary embodiment of the present invention. As previously described, switching between an I-signal and a Q-signal in relatively quick succession may permit an output vector 520 to be constructed from the combined I- and Q-signals. Additionally, having the separate Q-signal may permit the processor to use the Q-component 525 to determine the sign of the phase error and resolve phase ambiguity between potential solutions having phase of vector 520 or vector 521.

It is noted that FIG. 5 is a graphical illustration of an exemplary operation which may be performed within a processor (e.g., 480 in FIG. 4) as part of a predistortion control function for determining (e.g., estimating, calculating, etc.) an appropriate phase and amplitude compensation in response to the received input signal 405 and I- and Q-signals. Thus, in response to the results of the exemplary predistortion control function represented by FIG. 5, the processor 480 generates amplitude error compensation signal 482 and phase error compensation signal 484, which signals 482, 484 are transmitted to the DPD device 410 for adjusting the predistortion by performing AMAM compensation 412 and AMPM compensation 414.

Figure 6:
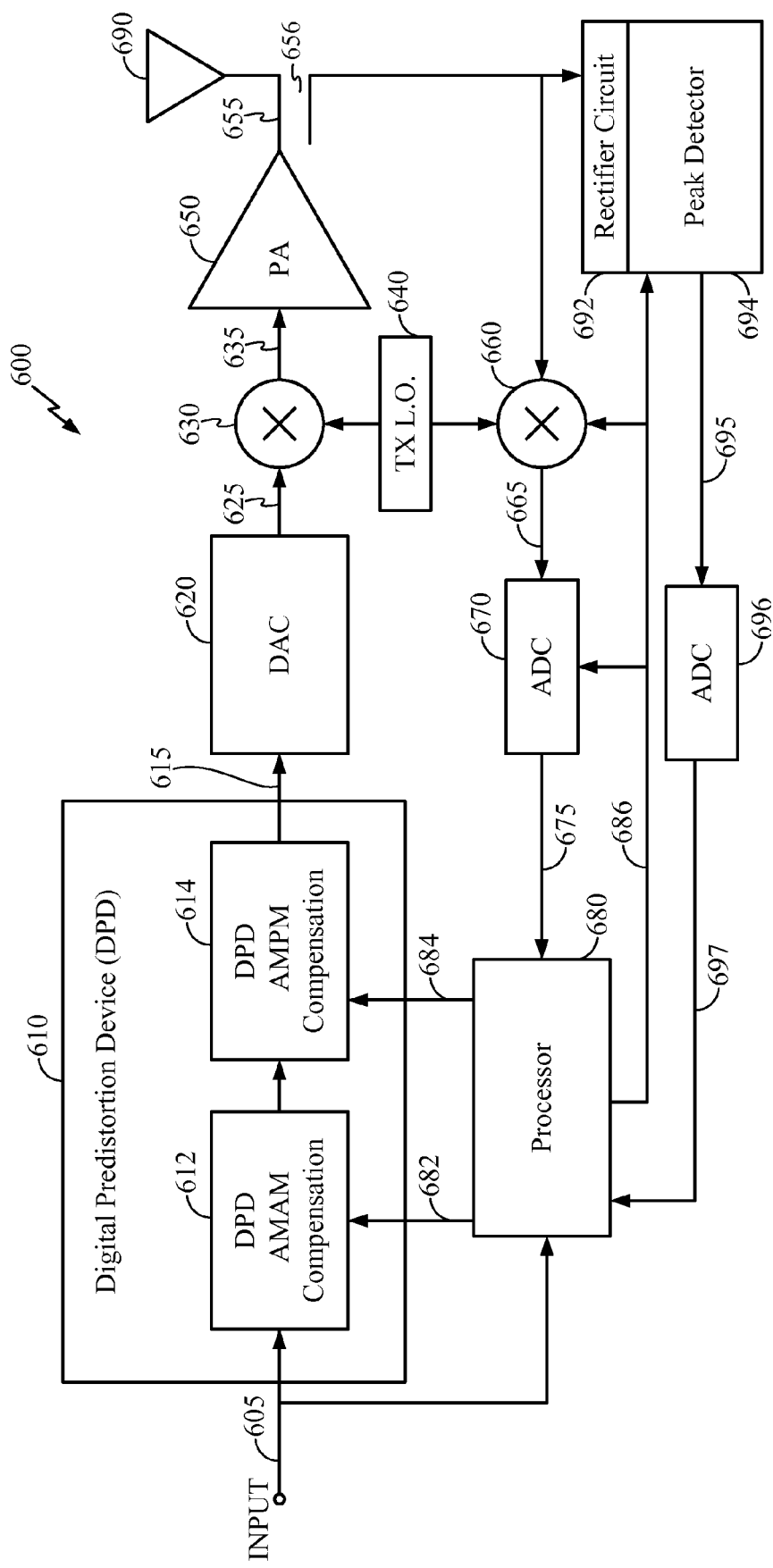
FIG. 6 illustrates a transmitter system in accordance with an exemplary embodiment of the present invention.

FIG. 6 illustrates a transmitter system 600 in accordance with an exemplary embodiment of the present invention. In the forward path, transmitter system 600 includes DPD device 610, DAC 620, up-converting mixer 630, and PA 650, which may be configured as previously described with respect to similar components illustrated by FIG. 2. Similarly named and numbered signals may also be similarly configured. In the feedback path, the transmitter system 600 includes down-converting mixer 660, ADC 670, and processor 680. The transmitter system 600 further includes an additional feedback path including a rectifier circuit 692 and peak detector 694 configured to generate a peak analog signal 695 that is converted to a peak digital signal 697 by ADC 696. Peak digital signal 697 is received by processor 680. ADC 696 may be a low data rate ADC for low data rate feedback to provide to the localized peak information to the processor 680 to add additional sample points in the AMAM distortion characteristics. In other words, ADC 696 may operate at a relatively lower data rate than ADC 670.

The rectifier circuit 692 may comprise a diode or a squaring circuit that is configured to convert the output signal 655 to a baseband signal without phase information. Thus, the additional feedback path is configured to generate amplitude information regarding the output signal 655 rather than phase information.

The peak detector 694 is configured to detect a localized peak of the output signal 655, which localized peak is transmitted to the processor 680 for a determination of the amplitude and phase error compensation, which information may be transmitted to the DPD device 610 through amplitude error compensation signal 682 and phase error compensation signal 684.

The control trigger signal 686 controls the sampling of the ADC 670, down-converting mixer 660, and also determines the sampling window for the peak detector 694 by controlling a start time and a stop time for the peak detector 694 to identify a localized peak. Once the localized target peak of the input signal 605 has been identified, the processor 680 determines a localized sampling window for applying to the output signal 655 which will include the amplified localized target peak. The localized sampling window may be based upon sampling window constraints, including propagation delay associated with, for example, group delay. Accordingly, the processor 680 determines the delay between detection of a localized target peak on the input signal 605 by the processor 680 to the amplified localized peak appearing at the output signal 655. Based upon the determined propagation delay, the processor 680 generates a control trigger signal 686 signaling the timing of the localized sampling window to the peak detector 694.

In other words, in response to the control trigger signal 686, the processor 680 measures or estimates the peak power or voltage of the output signal 655 of the PA 650 as indicated by the peak detector 694 for a sequence of n samples over the localized sampling window.

Based on the input signal 605, the digital feedback signal 675, and the peak digital signal 697, the processor 680 modifies the amplitude error compensation signal 682 and the phase error compensation signal 684 so that these signals 628, 684 better reflect (e.g., reduce or offset distortion) the actual performance of the PA 650. The processor 680 then sends the amplitude error compensation signal 682 and the phase error compensation signal 684 to the DPD device 610, which responsively predistorts the input signal 605 to achieve a target or specified output RF signal for the transmitter system 200. The process may be repeated again as desired or specified. Any of the above-described operations may have appropriate validity checks to ensure that the adapted amplifier model substantially reflects the actual performance of the amplifier.

Figure 7A:
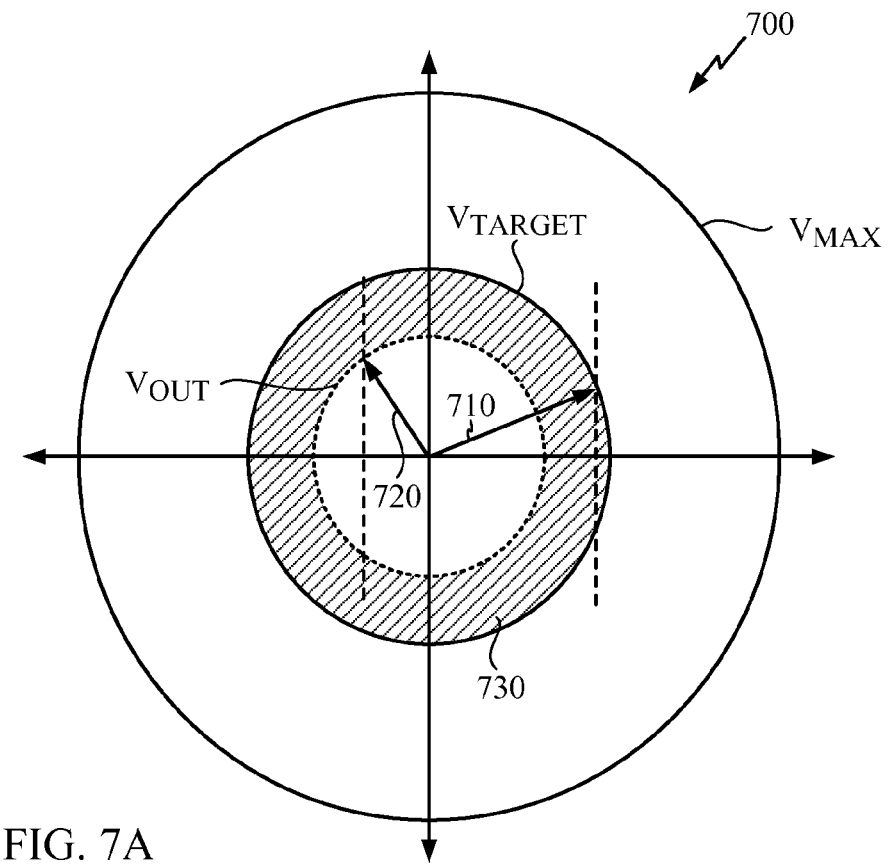
FIGS. 7A-7C are graphs including complex signals represented as vectors, which may be employed in determining compensation signals in accordance with an exemplary embodiment of the present invention.
Figure 7B:
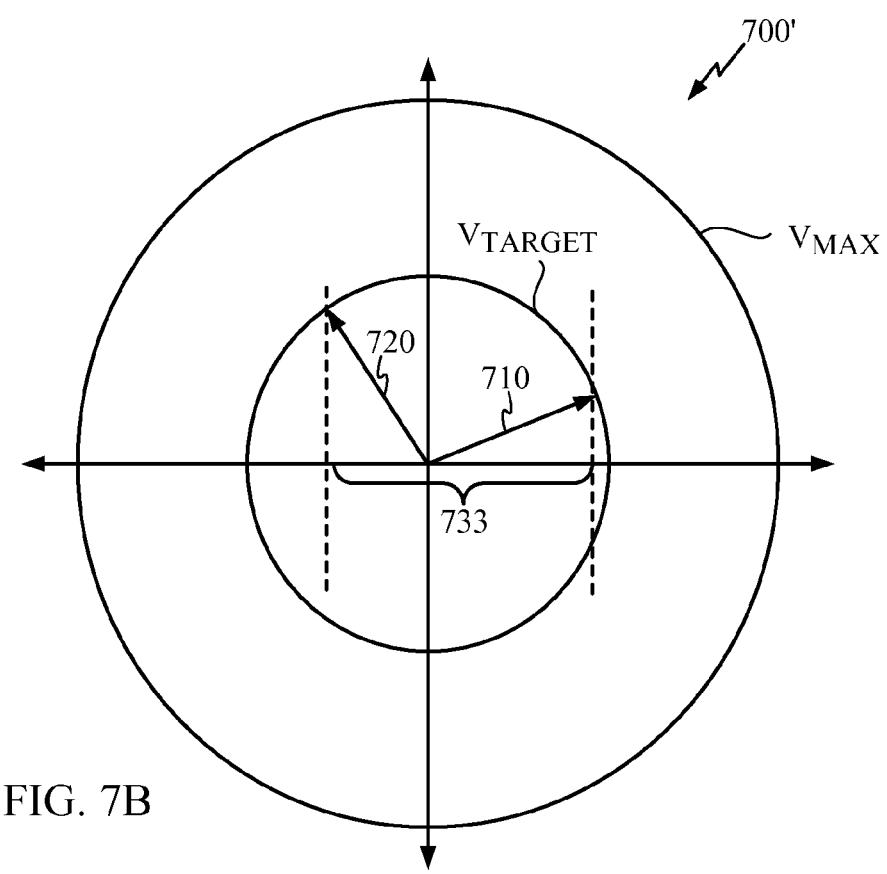
Figure 7C:
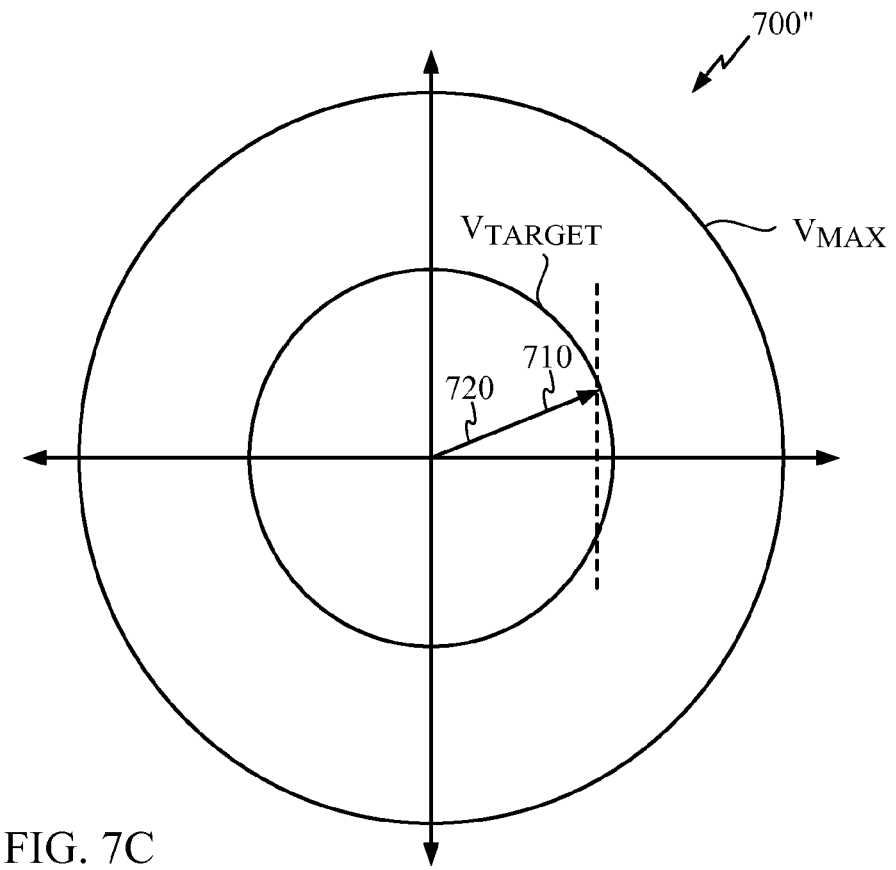

FIGS. 7A-7C are graphs 700, 700', 700" including complex signals represented as vectors 710, 720, which may be employed in determining compensation signals (e.g., 682, 684 of FIG. 6) in accordance with an exemplary embodiment of the present invention. In other words, FIGS. 7A-7C illustrate an exemplary method for determining the desired compensation for predistorting the input signal to generate the desired output signal from the power amplifier.

It is noted that FIGS. 7A-7C are a graphical illustration of exemplary operations which may be performed within a processor as part of a predistortion control function for determining (e.g., estimating, calculating, etc.) an appropriate phase and amplitude compensation values in response to the received input signal 605, digital feedback signal 675, and peak digital signal 697. Thus, in response to the results of the exemplary predistortion control function represented by FIGS. 7A-7C, the processor 680 generates amplitude error compensation signal 682, phase error compensation signal 684, which signals 682, 684 are transmitted to the DPD device 610 for adjusting the predistortion of the input signal 605 by performing AMAM compensation 612 and AMPM compensation 614.

The horizontal axes of graphs 700, 700', 700" represent the real components of the complex signals, and the vertical axes represent the imaginary components of the complex signals. Each of FIGS. 7A-7C illustrate a target reference vector 710 and an output vector 720. Each vector 710, 720 may be represented by a magnitude (i.e., length of the vector) and a phase (i.e., angle between the vector and the positive real axis) of a complex signal at an instant in time. Circle $V_{TARGET}$ represents the amplitude of the target reference vector 710 with a given complex pair. Circle $V_{OUT}$ represents the amplitude of the output vector 720 with a given complex pair.

By way of example, the target reference vector 710 may be an input signal (e.g., 605 of FIG. 6), and the output vector may be a corresponding digital feedback signal (e.g., 675 of FIG. 6) as received by a processor (e.g., 680 of FIG. 6) for the substantially same instant of time. In particular, FIG. 7A illustrates a graph 700 illustrating that the output vector 720 exhibits both amplitude error and phase error, which errors may be caused by distortion in a power amplifier. The peak digital signal (e.g., 697 in FIG. 6) may be used by the processor to determine the region 730, which represents the difference in amplitude between the output vector 720 and the target reference vector 710.

FIG. 7B is a graph 300' illustrating a status of vectors 710, 720 within a processor at a later stage in the exemplary analysis for determining the desired compensation for phase error and amplitude error. For example, the processor may execute a function that determines the amplitude compensation for the output vector 720 responsive to the peak value of the output signal. The phase compensation value may then be determined by determining a phase compensation value that results in a minimum value in the difference 335 between real components 315 and 325 reaches a minimum. For example, the processor may execute a function that varies the phase for the output vector 320 until the difference 335 between real components 315 and 325 reaches a minimum value with the amplitude and phase corrected. As shown in FIG. 7C, when both amplitude and phase of the two vectors 710, 720 exists then the vectors 710, 720 are substantially the same. During a predistortion operation, information related to the amplitude and phase compensation values may be transmitted from a processor (e.g., 680 of FIG. 6) to a DPD device (e.g., 610 of FIG. 6) and the DPD device 610 may apply the AMAM compensation 612 and AMPM compensation 614 on the input signal 605 in response thereto.

Figure 8:
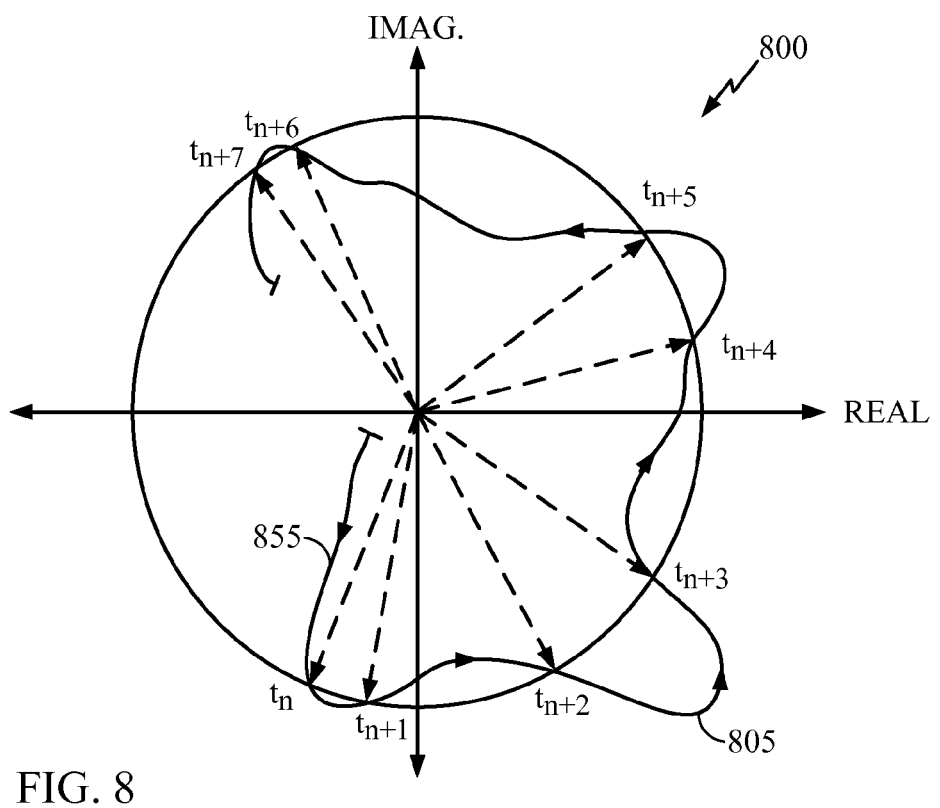
FIG. 8 illustrates an exemplary sampling scheme for a transmitter system according to an exemplary embodiment of the present invention.

FIG. 8 illustrates an exemplary sampling scheme 800 for a transmitter system according to an exemplary embodiment of the present invention. The sampling scheme 800 may be the basis for the control trigger signal enabling components of the feedback path. For example, the processor may be configured to sample the feedback signals (e.g., digital feedback signals, I- and Q-signals, peak digital signal, etc.) at a desired predetermined sample rate, at the occurrence of certain events, other sampling schemes, or any combination thereof.

As illustrated by FIG. 8, a processor may sample the feedback signals at the occurrence of a certain event. For example, a processor may receive an input signal 805. When the input signal 805 reaches a target amplitude (i.e., at times $t_n$, $t_{n+1}, \ldots, T_{n+7}$), the processor may be configured to sample both the input signal 805 and a feedback signal for a corresponding instant in time (e.g., through enabling control trigger signal). In other words, the processor may be configured to wait to sample the input signal 805 and the output signal through the feedback path at certain known events in order to focus on generating amplitude and phase compensation signals based on the amplitude and phase error when comparing the input and output signals at instances in time when such known events occur.

Other events may include when the input signal 805 reaches a target phase (e.g., when input signal 805 crosses the REAL axis, at every 45 degree angles, etc.). Another sampling scheme may include sampling according to a desired clock rate. Other sampling schemes may also be contemplated.

Figure 9:
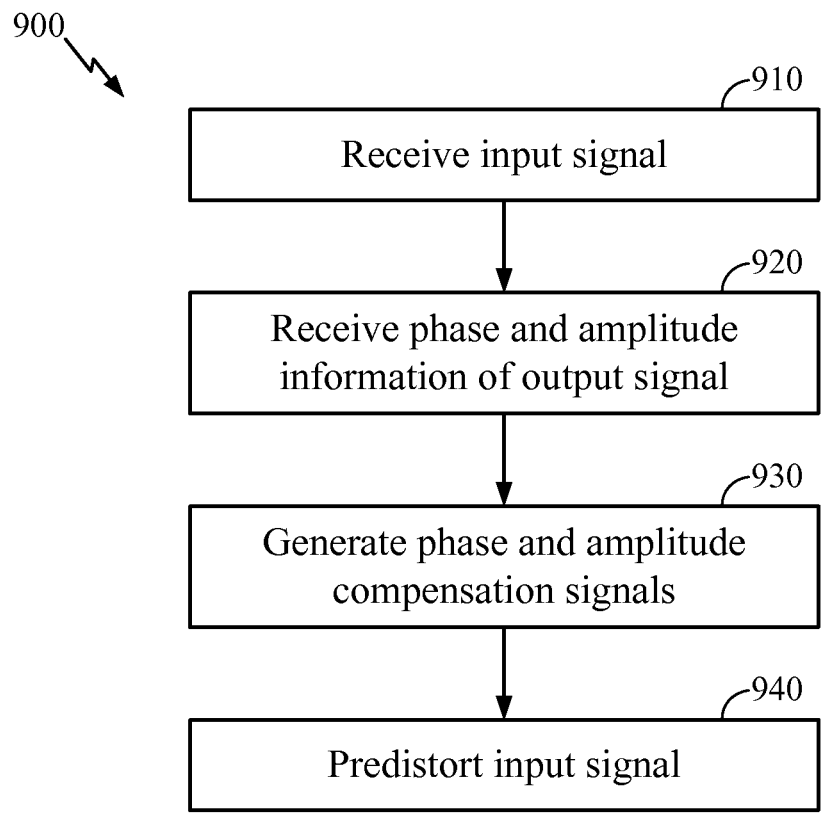
FIG. 9 illustrates a flow diagram for an exemplary method of determining a determining amplitude and phase error compensation signals for predistortion of an input signal in accordance with an exemplary embodiment of the disclosure.

FIG. 9 illustrates a flow diagram 900 for an exemplary method of determining a determining amplitude and phase error compensation signals for predistortion of an input signal in accordance with an exemplary embodiment of the disclosure. The method comprises receiving 910 an input signal to a forward path of a transmitter system including an amplifier. The method further comprises receiving 920 phase and amplitude information of an output signal from the amplifier through a single path of a feedback path. The method further comprises generating 930 a phase error compensation signal and an amplitude error compensation signal for the input signal based on an input-output signal characteristic of the amplifier based on the phase and amplitude information of the output signal and the input signal. The method further comprises predistorting 940 the input signal responsive to the phase error compensation signal and the amplitude error compensation signal.

Figure 10:
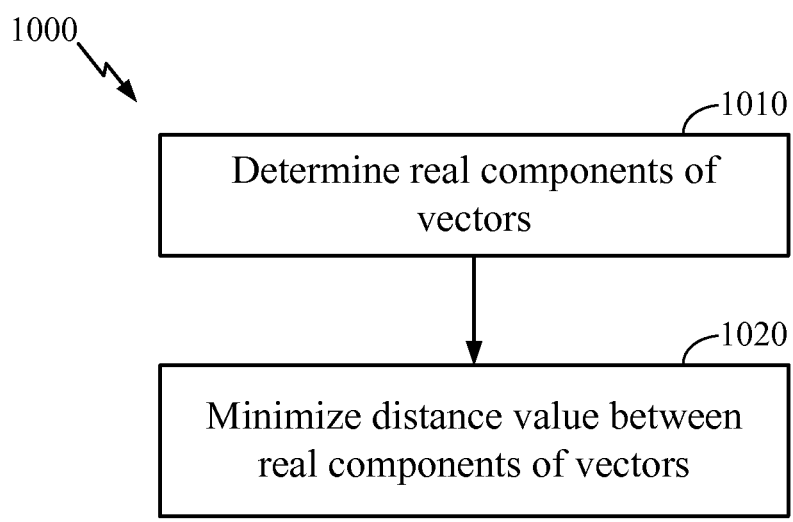
FIG. 10 illustrates a flow diagram for an exemplary method of performing a predistortion control function for determining an appropriate phase and amplitude compensation for an input signal.

FIG. 10 illustrates a flow diagram 1000 for an exemplary method of performing a predistortion control function for determining an appropriate phase and amplitude compensation for an input signal. The method includes determining 1010 the real components of two vectors. The two vectors may be an output signal and an input signal of a transmitter system, the output signal and input signal being complex waveforms. The output signal include phase and amplitude information that may be received from a single path of the feedback path of the transmitter system. The method further includes minimizing 1020 the distance value between the real components of the vectors. Minimizing 1020 the distance value may include altering the phase of the output vector until a minimum between the real components is determined (e.g., estimated). The phase compensation needed to obtain this minimum value may be the phase compensation value transmitted to a DPD device for predistorting an input signal to the transmitter system. From the phase compensation value, an amplitude compensation value may also be determined (e.g., estimated) and transmitted to a DPD device for predistorting an input signal to the transmitter system.

Figure 11A:
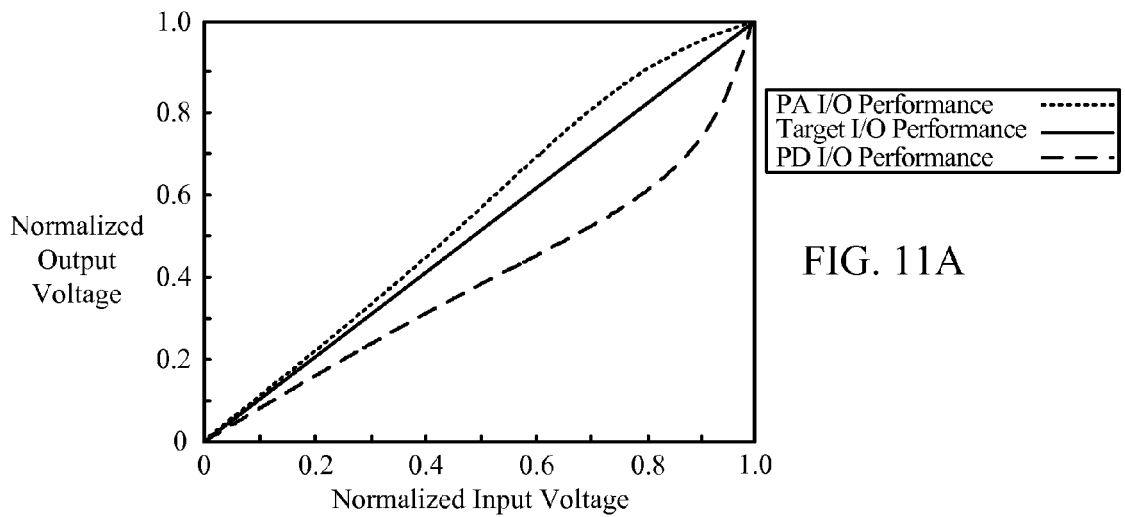
FIGS. 11A-C illustrate graphs of exemplary normalized output-input responses for the power amplifier, the predistortion device, and the transmitter system in accordance with another exemplary embodiment of the disclosure.
Figure 11B:
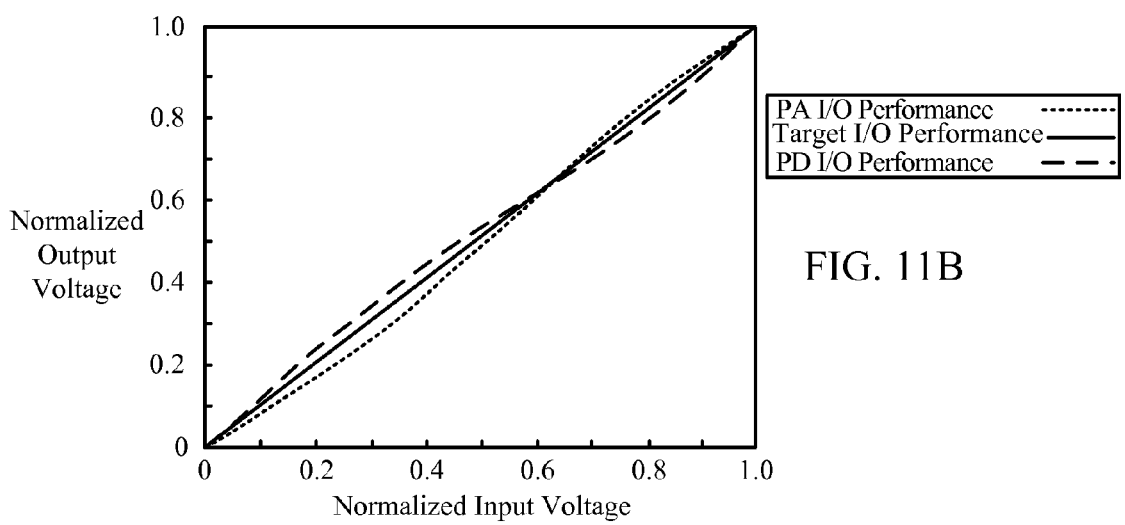
Figure 11C:
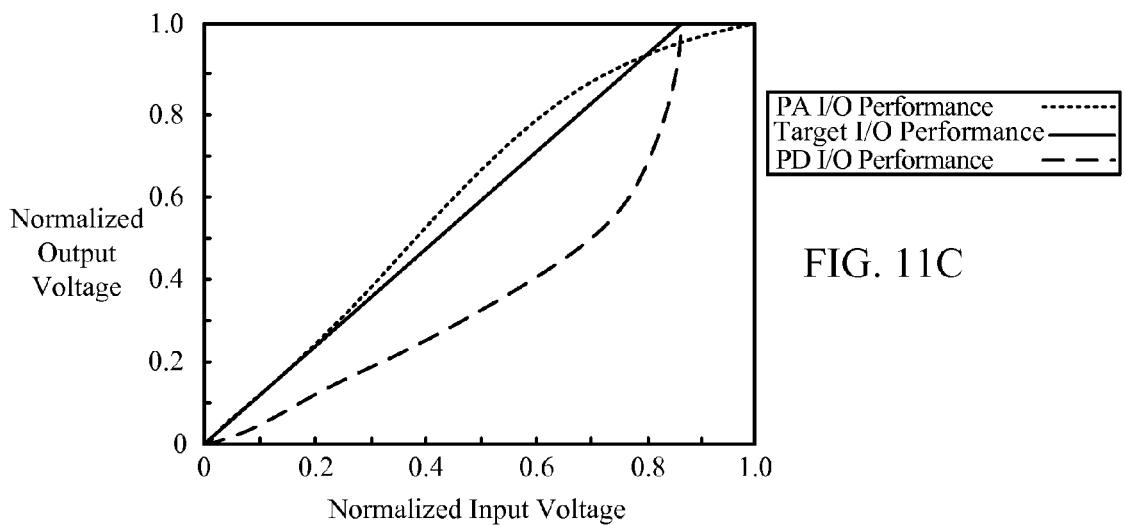

FIGS. 11A-C illustrate graphs of exemplary normalized output-input responses for the power amplifier, the predistortion device, and the transmitter system in accordance with another exemplary embodiment of the disclosure. The vertical axis of the graphs indicates the normalized output voltage, where the value 1.0 indicates the target or specified maximum instantaneous output voltage of the power amplifier. The horizontal axis of the graphs indicates the normalized input voltage, where the value 1.0 indicates the input voltage that corresponds to the target or specified maximum instantaneous output voltage of the power amplifier. The upper graph (FIG. 11A) is an exemplary response where the average output power of the power amplifier 106 is set to a moderate level. The middle graph (FIG. 11B) is an exemplary response where the average output power is set to a relatively low level. The lower graph (FIG. 11C) is an exemplary response where the average output power is set to a relatively high level.

In these examples, the solid line on the graphs indicate the target or specified normalized output-input response for a transmitter system (e.g., FIGS. 2, 4, 6). As the graph illustrates, the target response may be primarily a linear response as indicated by the top and middle graphs. However, it shall be understood that the target response need not be substantially linear (e.g., FIG. 11C). For example, clipping may occur. The dotted line of the graphs indicates the normalized input-output signal response for a power amplifier. The dashed line of the graphs indicates the normalized input-output signal response of a predistortion device. As these graphs illustrate, for a given normalized input level, the normalized input-output responses of the predistortion device and the power amplifier are situated on opposite sides of the target response. In this way, the input-output response of the predistortion device combined with the input-output response of the power amplifier should substantially produce the input-output target response for the transmitter system.

Figure 12:
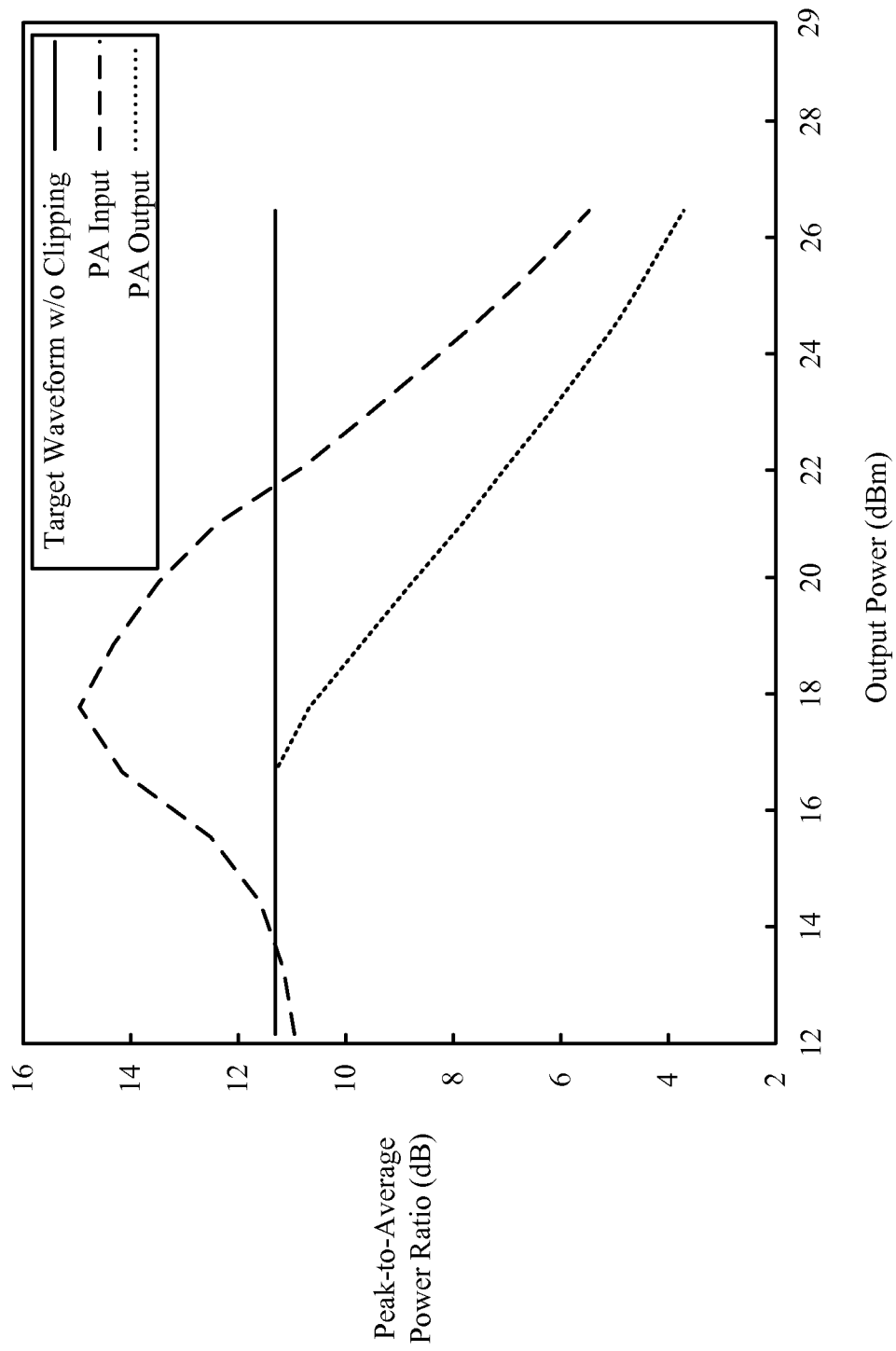
FIG. 12 illustrates a graph of an exemplary peak-to-average power ratio versus power for the input, output, and target output for a power amplifier in accordance with another exemplary embodiment of the disclosure.

FIG. 12 illustrates a graph of an exemplary peak-to-average power ratio versus power for the input, output, and target output for a power amplifier in accordance with another exemplary embodiment of the disclosure. The vertical axis represents the peak-to-RMS ratio in dB for the corresponding signal, and the horizontal axis represents the average output power level in dBm for the corresponding signal. The dotted line represents the relationship between the peak-to-average power ratio to the average output power of the corrected output signal of the power amplifier. The dashed line represents the relationship between the peak-to-average power ratio to the average output power of the input signal of the power amplifier. And, the solid line represents the relationship between the peak-to-average power ratio to the power for the idealized or target output signal of the power amplifier.

As the graph illustrates, the peak-to-average power ratio value of the compensated output signal of the power amplifier tracks the ideal values until the input signal hits the saturated power level, then decreases gradually above a power level of 17 dBm. This is due to the saturation properties of the power amplifier that limit the maximum signal level. In order to compensate for the compression effects of the power amplifier, a predistortion device may perform signal crest enhancement by predistorting the input signal in order to increase the peak-to-average power ratio. This can be seen in the graph (from the dashed line) by the rise in the peak-to-RMS ratio of the input signal to the power amplifier. The overall effect of this compensation is to substantially maintain the peak-to-average ratio substantially constant over the operating range of the transmitter system, as illustrated by the substantially flat response of the power amplifier peak-to-average power ratio (dotted line), which is coincident with the target over the low and moderate power ranges.

Figure 13A:
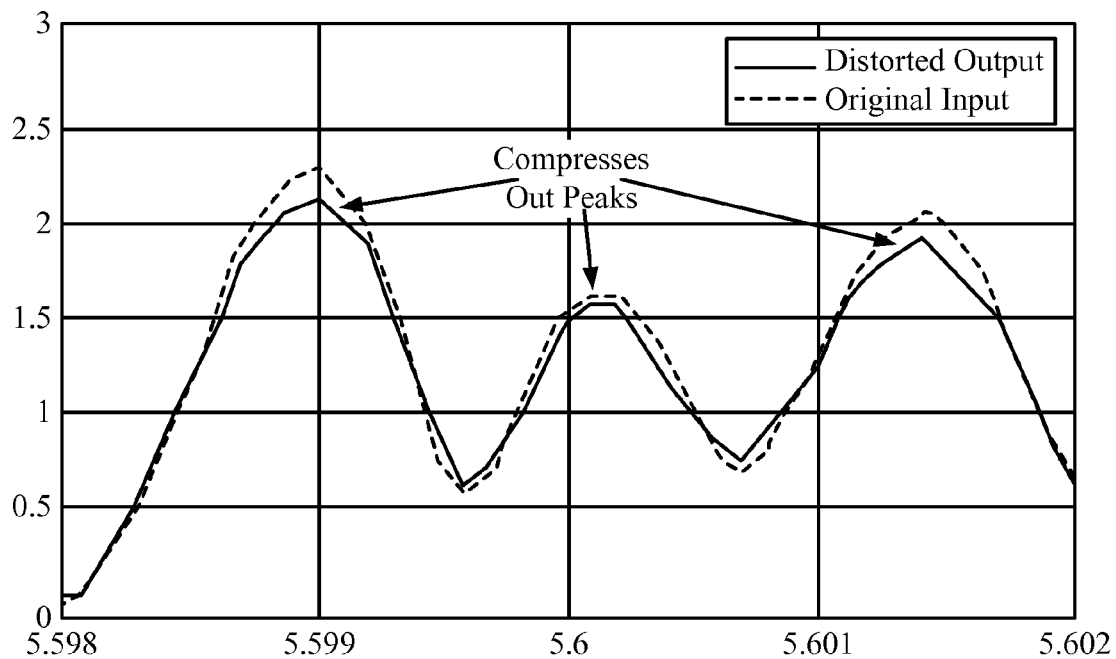
FIG. 13A illustrates a time-domain graph of exemplary undistorted or original input and corresponding distorted output signals in accordance with another exemplary embodiment of the invention.

FIG. 13A illustrates a time-domain graph of exemplary undistorted or original input and corresponding distorted output signals in accordance with another exemplary embodiment of the invention. The vertical axis represents amplitude of the signals, and the horizontal axis represents time. As the graph illustrates, the original input signal shown as a dashed line may not have compressed peaks as shown. However, the output signal shown as a solid line may have compressed peaks due to the non-linear characteristic of the power amplifier when operated near its saturation region.

Figure 13B:
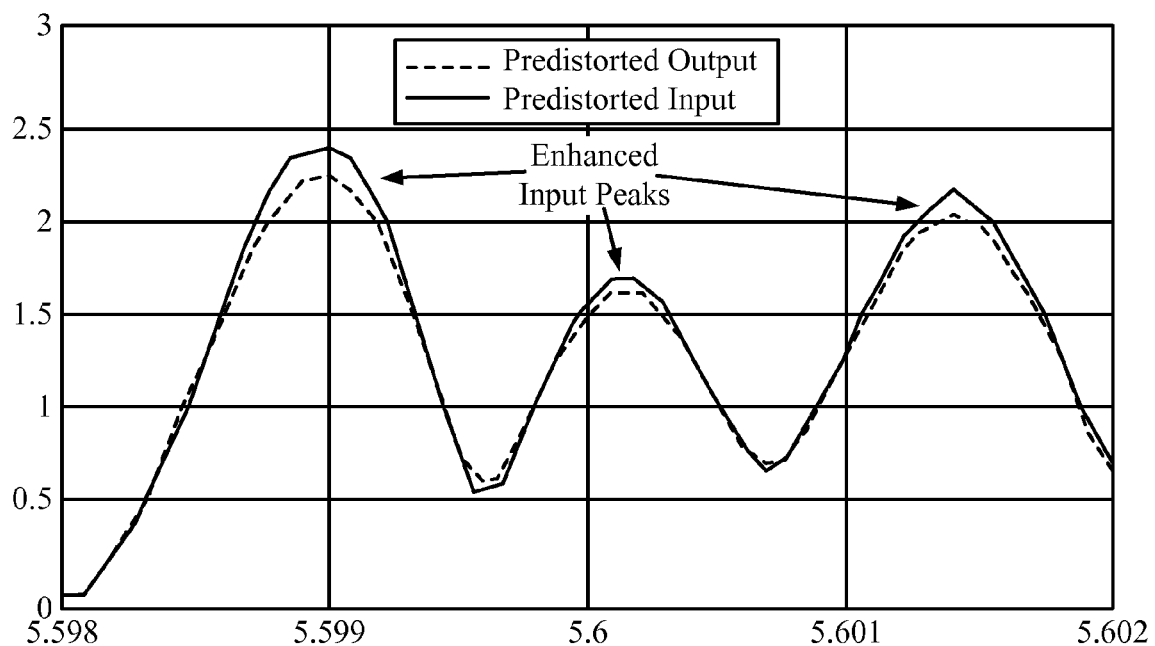
FIG. 13B illustrates a time-domain graph of exemplary predistorted input and output signals in accordance with another exemplary embodiment of the invention.

FIG. 13B illustrates a time-domain graph of exemplary predistorted input and output signals in accordance with another exemplary embodiment of the invention. Again, the vertical axis represents amplitude of the signals, and the horizontal axis represents time. As the graph illustrates, the input signal shown as a solid line has been predistorted by the predistortion device in order to enhanced its peaks as shown. The result is that the output signal shown as a dashed line no longer has compressed peaks. Thus, the amplifier modeling and predistortion techniques described herein may be used to achieve a target output signal, such as like the one shown in this graph.

With regard to generally the rate of providing information of the power amplifier output for the purpose of developing an amplifier model and predistorting an input signal based on the amplifier model, it can be done at any rate in accordance with the exemplary embodiments previously discussed. For instance, the rate may be at the modulation rate of the RF output signal, which could be as high as 200 GHz. Alternatively, the rate may be at the envelope rate (e.g., at the modulation bandwidth). Alternatively, the rate may be at the power control rate, which may depend on the modulation rate and a scheduler. Alternatively, the rate may be at the model evolution rate, which may be based on changes in the operation environment parameters, such as temperature, power supply voltage Vcc, and frequency of the signal. The model evolution rate may be updated as necessary, and could be as fast as or faster than the power control rate.

It shall be understood the elements and operations of the exemplary transmitter systems discussed above may be implemented in the digital domain, analog domain, or a combination of the digital and analog domain, and that specific references to signals as being "analog" or "digital" is intended to be considered an example and not a limitation thereof. The system may further use dedicated hardware, programmable hardware, processor operating under the control of one or more software modules, or any combination thereof, to perform its intended functions as discussed above.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A transmitter system, comprising:
  a forward path including a predistortion device coupled with an amplifier, the forward path configured for digitally predistorting a digital input signal to the predistortion device in response to a phase error compensation signal and an amplitude error compensation signal in order to generate a desired output signal for upconverting into an output signal of the amplifier; and
  a feedback path including a processor configured for generating the phase error compensation signal and the amplitude error compensation signal based on a comparison of the digital input signal with phase and amplitude information of the output signal of the amplifier, wherein the phase and amplitude information of the amplifier are transmitted to the processor on a single path of the feedback path.

2. The transmitter system of claim 1, further including a local oscillator configured for providing an up-converting signal to an up-converting mixer in the forward path, and a down-converting signal to a down-converting mixer in the feedback path.

3. The transmitter system of claim 2, wherein the down-converting signal includes an I-signal and a Q-signal.

4. The transmitter system of claim 3, further including a switch coupled between the local oscillator and the down-converting mixer, wherein the switch is configured to alternate between the I-signal and the Q-signal in response to a switch control signal such that the I-signal and the Q-signal are alternatingly transmitted to the processor on the single path of the feedback path.

5. The transmitter system of claim 1, further including an additional feedback path including a peak detector configured for measuring a peak amplitude for power or voltage of the output signal of the amplifier.

6. The transmitter system of claim 5, wherein the processor determines a desired amplitude compensation based on a difference between the peak amplitude of the output signal of the amplifier and an amplitude of the input signal at a corresponding instant of time.

7. The transmitter system of claim 5, wherein the additional feedback path includes a rectifier circuit operably coupled between the peak detector and the amplifier, the rectifier circuit configured for converting the output signal of the amplifier to a baseband signal while removing phase information of the output signal of the amplifier.

8. The transmitter system of claim 7, wherein the feedback path and the additional feedback path each include an analog-to-digital converter, wherein the analog-to-digital converter of the additional feedback path is configured to operate at a relatively lower data rate than the analog-to-digital converter of the feedback path.

9. The transmitter system of claim 7, wherein the rectifier circuit includes at least one of a diode and a squaring circuit.

10. The transmitter system of claim 1, wherein the desired output signal is one of a target or a specified output signal for the amplifier.

11. The transmitter system of claim 1, wherein the desired output signal is has a reduced distortion.

12. The transmitter system of claim 1, wherein the comparison of the input signal with phase and amplitude information includes determining a phase compensation based on determining a minimum value between real components of the output signal and the desired output signal.

13. A method, comprising:
receiving a digital input signal to a forward path of a transmitter system including an amplifier;
receiving phase and amplitude information of an output signal from the amplifier through a single path of a feedback path;
generating a phase error compensation signal and an amplitude error compensation signal for the digital input signal based on an input-output signal characteristic of the amplifier based on the phase and amplitude information of the output signal and the digital input signal; and
digitally predistorting the digital input signal responsive to the phase error compensation signal and the amplitude error compensation signal to generate a desired output signal for upconverting into the output signal of the amplifier.

14. The method of claim 13, wherein receiving phase and amplitude information of an output signal includes activating a switch to alternatingly receive an I-signal and a Q-signal of the output signal through the single path of the feedback path.

15. The method of claim 13, wherein generating a phase error compensation signal and an amplitude error signal is further based on a peak power or peak voltage of the output signal of the amplifier.

16. The method of claim 13, wherein the phase and amplitude information comprises a plurality of samples of the output signal of the amplifier.

17. The method of claim 16, wherein the plurality of samples of the output signal of the amplifier are generated by sampling the output signal at responsive to a predetermined event.

18. The method of claim 17, wherein the predetermined event is based on a clock rate of the input signal.

19. The method of claim 17, wherein the predetermined event is based on an occurrence when the input signal reaches at least one of a predetermined amplitude and a predetermined phase.

20. The method of claim 13, wherein generating a phase error compensation signal includes determining real components of the output signal and the input signal and determining a phase compensation for the output signal that minimizes a magnitude distance between the real components of the output signal and the input signal.

21. The method of claim 13, wherein predistorting the input signal comprises predistorting the input signal to achieve a target or specified output signal for the amplifier.

22. The method of claim 13, wherein predistorting the input signal comprises predistorting the input signal to reduce distortion in the output signal.

23. An apparatus, comprising:
means for receiving a digital input signal to a forward path of a transmitter system including an amplifier;
means for receiving phase and amplitude information of an output signal from the amplifier through a single path of a feedback path;
means for generating a phase error compensation signal and an amplitude error compensation signal for the digital input signal based on an input-output signal characteristic of the amplifier based on the phase and amplitude information of the output signal and the digital input signal; and
means for digitally predistorting the digital input signal responsive to the phase error compensation signal and the amplitude error compensation signal to generate a desired output signal for upconverting into the output signal of the amplifier.

24. The apparatus of claim 23, wherein the means for receiving phase and amplitude information comprises means for sampling the output signal.

25. The apparatus of claim 23, wherein the means for receiving phase and amplitude information comprises means for alternatingly receiving an I- and a Q-signal of the output signal through the single path of the feedback path.

26. The apparatus of claim 23, further comprising means for measuring a peak power or a peak voltage of an output signal of the amplifier.

27. The apparatus of claim 23, wherein the predistorting means predistorts the input signal to achieve a target or specified output signal for the amplifier.

28. The apparatus of claim 23, wherein the predistorting means predistorts the input signal to reduce distortion in an output signal of the amplifier.

29. A computer program product, comprising:
a non-transitory computer-readable medium comprising:
code for causing a computer to receive a digital input signal to a forward path of a transmitter system including an amplifier;
code for causing a computer to receiving phase and amplitude information of an output signal from the amplifier through a single path of a feedback path;
code for causing a computer to generate a phase error compensation signal and an amplitude error compensation signal for the digital input signal based on an input-output signal characteristic of the amplifier based on the phase and amplitude information of the output signal and the digital input signal; and code for causing a computer to digitally predistort the digital input signal responsive to the phase error compensation signal and the amplitude error compensation signal to generate a desired output signal for upconverting into the output signal of the amplifier.

* * * * *